United States Patent
Dong et al.

(10) Patent No.: US 9,246,601 B2
(45) Date of Patent: Jan. 26, 2016

(54) OPTICAL RECEIVER

(76) Inventors: Yunzhi Dong, Toronto (CA); Kenneth W. Martin, Toronto (CA)

( * ) Notice: Subject to any disclaimer, the term of this patent is extended or adjusted under 35 U.S.C. 154(b) by 421 days.

(21) Appl. No.: 13/100,076

(22) Filed: May 3, 2011

(65) Prior Publication Data
US 2012/0281989 A1    Nov. 8, 2012

(51) Int. Cl.
*H04B 10/06* (2006.01)
*H04B 10/69* (2013.01)
*H03F 3/08* (2006.01)

(52) U.S. Cl.
CPC ............ *H04B 10/693* (2013.01); *H04B 10/695* (2013.01); *H03F 3/08* (2013.01)

(58) Field of Classification Search
CPC ....... H04B 10/695; H04B 10/693; H03F 3/08
USPC ......................................................... 398/202
See application file for complete search history.

(56) References Cited

U.S. PATENT DOCUMENTS

| | | | | | |
|---|---|---|---|---|---|
| 4,638,152 | A * | 1/1987 | Takada | .................. | H04B 10/693 250/214 A |
| 4,641,378 | A * | 2/1987 | McConnell | ............... | H03F 1/22 330/311 |
| 5,031,196 | A * | 7/1991 | Bahlmann | .............. | H04B 10/60 375/340 |
| 5,304,793 | A * | 4/1994 | Grasset | .............. | H04B 10/6911 250/214 A |
| 5,304,949 | A * | 4/1994 | Chun | ........................ | H03F 3/08 330/296 |
| 5,307,196 | A * | 4/1994 | Kinoshita | ............ | H04B 10/695 327/63 |
| 5,311,353 | A * | 5/1994 | Crawford | ................ | H03F 3/087 359/333 |
| 5,489,821 | A * | 2/1996 | Crockett | ............ | H05B 41/3922 315/151 |
| 5,777,507 | A * | 7/1998 | Kaminishi | ........... | H04B 10/695 327/100 |
| 5,793,256 | A | 8/1998 | Nagahori et al. | | |
| 5,875,049 | A * | 2/1999 | Asano | ....................... | H03F 3/08 250/214 A |
| 5,892,800 | A * | 4/1999 | Rybicki | .............. | H04L 25/4902 330/282 |
| 5,900,779 | A | 5/1999 | Giacomini | | |
| 6,037,841 | A * | 3/2000 | Tanji et al. | .................... | 330/308 |
| 6,055,283 | A * | 4/2000 | Rybicki | .............. | H04L 25/4902 330/282 |
| 6,128,354 | A * | 10/2000 | Rybicki | .............. | H04L 25/4902 330/282 |
| 6,218,905 | B1 | 4/2001 | Sanders et al. | | |
| 6,545,544 | B1 * | 4/2003 | Link | ........................ | H03F 3/08 330/110 |
| 7,042,295 | B2 * | 5/2006 | Guckenberger | .......... | H03F 3/08 250/214 A |
| 7,505,696 | B2 * | 3/2009 | Day | ......................... | H03F 1/26 375/345 |
| 7,605,358 | B2 | 10/2009 | Suzuki et al. | | |
| 8,509,629 | B2 * | 8/2013 | Zou | ........................ | H03F 3/082 330/277 |
| 2002/0089729 | A1 * | 7/2002 | Holcombe | ............. | H04B 10/40 398/202 |
| 2002/0109546 | A1 * | 8/2002 | Sanduleanu | ................. | 330/254 |

(Continued)

OTHER PUBLICATIONS

David G. Nairn, et al., "Current-Mode Algorithmic Analog-to-Digital Converters, IEEE Journal of Solid-State Circuits", Aug. 1990, vol. 25, No. 4, pp. 997-1004 (8 pages).

(Continued)

*Primary Examiner* — Ken Vanderpuye
*Assistant Examiner* — Abbas H Alagheband
(74) *Attorney, Agent, or Firm* — Hanley, Flight & Zimmerman, LLC

(57) ABSTRACT

An optical receiver including a photo detector for converting a light signal into an electrical current signal and a preamplifier circuit for receiving the electrical current signal and outputting a corresponding voltage signal. In one example, the preamplifier circuit includes a first transistor having: (i) a high impedance node connected to an input node connected to receive the electrical current signal from the photo detector, and (ii) a control terminal connected to receive active negative feedback proportional to the electrical current signal received at the input node.

21 Claims, 11 Drawing Sheets

(56) References Cited

U.S. PATENT DOCUMENTS

| | | | |
|---|---|---|---|
| 2002/0191263 A1* | 12/2002 | Hoang et al. ............... | 359/189 |
| 2003/0025562 A1* | 2/2003 | Andreou et al. ............. | 330/308 |
| 2004/0113694 A1 | 6/2004 | Paillet et al. | |
| 2005/0218994 A1* | 10/2005 | Guckenberger .......... | H03F 3/08 |
| | | | 330/308 |
| 2006/0103471 A1* | 5/2006 | Noda ....................... | H03F 1/34 |
| | | | 330/308 |
| 2006/0263100 A1* | 11/2006 | Uesaka et al. ............... | 398/202 |
| 2008/0007343 A1* | 1/2008 | Natzke ....................... | 330/308 |
| 2008/0197890 A1* | 8/2008 | Yoshikawa et al. ........... | 327/103 |
| 2009/0243729 A1* | 10/2009 | Gao .......................... | H03F 3/08 |
| | | | 330/296 |
| 2010/0052778 A1* | 3/2010 | Baranauskas et al. ........ | 330/109 |
| 2012/0281989 A1* | 11/2012 | Dong ................... | H04B 10/693 |
| | | | 398/202 |

OTHER PUBLICATIONS

Sunderarajan S. Mohan, et al, "A 2.125 Gbaud 1.6k ohm Transimpedance Preamplifier in 0.5um CMOS", IEEE Custom Integrated Circuits Conference 1999, pp. 513-516 (4 pages).

S. Brigati, et al, "A 20 Mbit/s Integrated Photoreceiver with Digital Outputs in 0.6 um CMOS Technology", IEEE European Solid-State Circuit Conference 2002, pp. 503-506 (4 pages).

B. Wicht, "Current Sense Amplifiers for Embedded SRAM in High-Performance System-on-a-Chip Designs", Springer-Verlag Berlin Heidelberg New-York, ISSN 1437-0387, ISBN 3-540-00298-7, pp. 64-65 (1 page).

Michael Fortsch, et al, "220 MHz Optical Receiver with Large-Area Integrated PIN Photodiode", Proceedings of IEEE, Sensors, 2003, pp. 1012-1015 (4 pages).

H. Hein, et al, "Low-Power 300 Mbit/s OEIC with large-area photodiode", Electronics Letters, Mar. 2005, vol. 41, No. 7 (2 pages).

Sung Min Park, et al, "1.25-Gb/s Regulated Cascode CMOS Transimpedance Amplifier for Gigabit Ethernet Applications", IEEE Journal of Solid-State Circuits, Jan. 2004, vol. 39, No. 1, pp. 112-121 (10 pages).

Christian Kromer, et al, "A Low-Power 20-GHz 52-dB ohm Transimpedance Amplifier in 80-nm CMOS", IEEE Journal of Solid-State Circuits, Jun. 2004, vol. 39, No. 6, pp. 885-894 (10 pages).

Wei Zen Chen, et al, "A 2.5 Gbps CMOS Fully Integrated Optical Receiver with Lateral PIN Detector", IEEE Custom Integrated Circuits Conference, 2008, pp. 293-296 (4 pages).

P. Vijaya Sankara Rao, et al, "A new current-mode receiver for high-speed electrical/optical link", Int. J. Electron. Commun. (AEU), Jan. 2010 (10 pages).

* cited by examiner

OPTICAL RECEIVER

BACKGROUND

This disclosure relates to optical receiver circuits.

In fiber optical receivers, a photo-detector is generally used to capture an input optical signal and convert it into electrical current signal that is provided to an electronic receiver circuit that includes a pre-amplifier. Semiconductor P-I-N and P-N diodes are generally used as photo-detectors and they exhibit parasitic capacitance to the electronic receiver circuit due to their reverse bias junctions. The photo-detector and the receiver circuit comprise the optical receiver front-end.

SUMMARY

According to an example embodiment is an optical receiver including a photo detector for converting a light signal into an electrical current signal and a preamplifier circuit for receiving the electrical current signal and outputting a corresponding voltage signal. The preamplifier circuit includes a first transistor having: (i) a high impedance node connected to an input node connected to receive the electrical current signal from the photo detector, and (ii) a control terminal connected to receive active negative feedback proportional to the electrical current signal received at the input node.

According to another example embodiment is an optical receiver that includes a photo detector circuit for converting a light signal into an electrical signal and a preamplifier circuit for receiving the electrical signal and outputting a corresponding output signal. The preamplifier circuit includes: a first input transistor having a low impedance node connected to a first input node to receive a first component of the electrical signal from the photo detector, a second input transistor having a low impedance node connected to a second input node to receive a second component of the electrical signal from the photo detector, and a boost stage for amplifying the first component of the electrical signal and the second component of the electrical signal and providing the amplified first component to a control terminal of the second input transistor and the amplified second component to a control terminal of the first input transistor.

According to another example embodiment is a photo detector circuit for converting a light signal into an electrical signal. The photo detector circuit includes a first photo detector for receiving the light signal; and a second photo detector that is substantially identical to the first photo detector but is shielded from receiving the light signal, with the first photo detector and second detector each being connected to a common virtual ground.

According to an example embodiment is a method of converting a light signal into an electrical voltage signal comprising:

at a photo detector, converting the light signal into an electrical current signal;

at preamplifier circuit, receiving the electrical current signal at a high impedance node of a transistor while receiving an active negative feedback signal at a control terminal of the transistor that is proportional to the electrical current signal, the electrical voltage signal being derived from a low impedance node of the transistor.

FIGURES

DETAILED DESCRIPTION

In high speed digital signal transmission systems that aim for a low error rate, the bandwidth of the optical receiver front-end ideally achieves a high percentage of the maximum data rate. By way of example, in one illustrative application for a 5 Gbit/s digital data rate, the bandwidth of the optical receiver front-end in a low error rate system should be larger than 3.5 GHz. The parasitic junction capacitance from the photo-detector and the input impedance of the electronic optical receiver circuit will form a 1st order low pass filter which attenuates high frequency signals. Thus, the input impedance of the receiver circuit should be low enough to drive the parasitic photo-detector capacitance. On the other hand, noise added by the receiver front-end should be kept low to allow reasonable input sensitivity.

According to one example embodiment is a power-efficient optical receiver circuit where low input impedance is realized. A common gate/common base boost stage is realized directly on top of an input common source/common emitter transistor such that both the input transistor and the boost stage share the same bias current which is power efficient. Additional enhancement to boost the voltage gain of the stacked common gate/base branch can be added to further reduce its input impedance to drive even larger input capacitance in both single-ended or differential fashion.

Such an input circuit may for example be utilized to drive large photo capacitance in fiber-optic receiver implementations where parasitic capacitance from the photo-detector is limiting the speed of the receiver, and specifically in combination with a large area silicon photo-detector for polymer implemented optical channels such as plastic optical fiber communications.

According to another example embodiment is an optical receiver circuit that includes a differential regulated cascode transimpedance amplifier with differential common gate/common base stages. The two differential inputs of the common gate/common base stage are cross-coupled to yield the correct differential signal polarity. In some applications, such a configuration may relieve the DC voltage headroom issues of traditional regulated cascode transimpedance amplifiers that have a common source boost stage without substantially affecting the performance. Further passive enhancement can also be added to enhance stability and reduce high frequency input impedance.

In some examples, such a differential input circuit can be used in a low supply CMOS fabrication process where a traditional regulated-cascode transimpedance amplifier is difficult to fit, including for example applications where a large area silicon photo-detector is integrated in an advanced CMOS process for plastic optical fiber communications.

Figure 9:
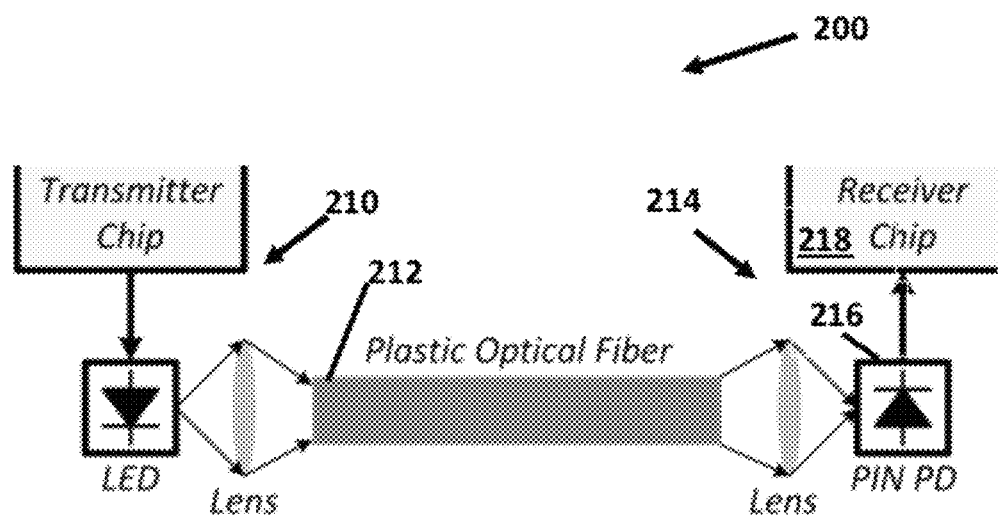
FIG. 9 is a block diagram representation of a plastic optical fiber link with LED as a light source.

In at least some example embodiments the optical receiver circuits described herein can be applied to optical channels, including polymer implemented optical channels such as plastic optical fiber (POF) channels. POF can in some applications provide low-data-rate communications with easy handling and high immunity to electromagnetic interference. Traditional fiber technologies such as single-mode fiber (SMF) and multimode fiber (MMF) use glass or silica fiber cores for light transmission, while POF utilizes plastic cores. An example of a POF link 200 is shown in FIG. 9. The POF data link of FIG. 9 consists of three parts: (1) a transmitter 210 (including a driver, a light source such as a light emitting diode (LED) that converts electrical signals into optical pulses, and a lens that helps to couple the light into the POF); (2) a communication channel 212, realized for example by a polymethylmethacrylate (PMMA)-based POF cable; and (3) a receiver 214 (including a photo detector 216 (PD) that converts incoming optical pulses into electrical current signals and an optical receiver circuit 218 that includes a preamplifier circuit such as a transimpedance amplifier (TIA) that further processes the electrical current signals into volt signals). A lens similar to that used in the transmitter may be added at the receiver to help couple light from the POF into the PD, but the lens can be omitted in some configurations, for example when the sensitive area of the PD is similar in size to the POF core.

Figure 1:
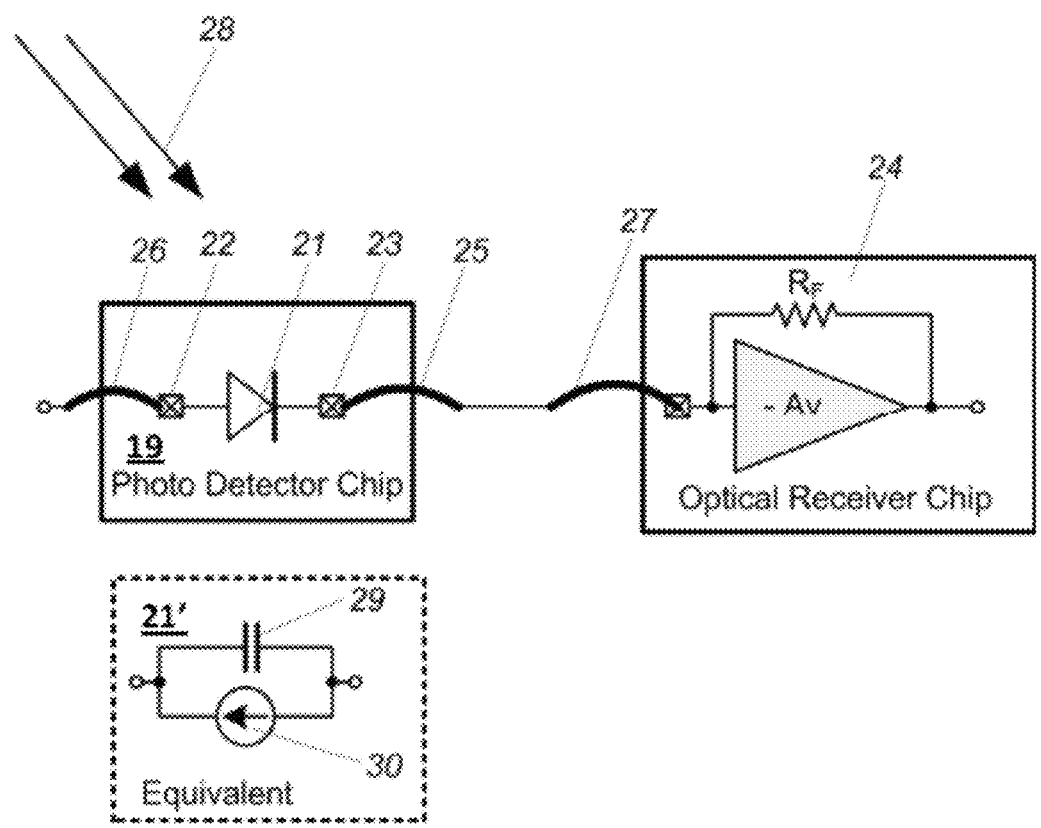
FIG. 1 is a schematic block diagram of an example of an optical receiver circuit assembled with a photo detector chip.

With reference to the receiver, FIG. 1 illustrates an example of a typical front-end assembly where a discrete photo detector chip 19 and an optical receiver chip 24 are assembled together to convert incoming optical light pulses 28 into electrical signal pulses. A photo detector 21 is realized on the photo detector chip 19 with a cathode node 23 and an anode node 22. A typical photo detector assembly introduces parasitic inductances at both nodes 22, 23. In FIG. 1, the anode 22 is connected to a bias voltage via wire 26, while its cathode 23 is connected to the input of the receiver chip 24 (which implements a preamplifier such as a transimpedance amplifier) via wires 25 and 27. The photo detector 21 itself can be modeled by a signal current source 30 in parallel with a source capacitance 29 as shown in dashed box 21'. At high frequencies, the parasitic inductances introduced by wires 25, 26, 27 together with the capacitance 29 will form a low pass filter and limit high speed operations.

Accordingly, a speed bottleneck in the front end of a POF receiver can originate from, among other things, the parasitic bond-wire inductance between the photodetector circuit (e.g. a photodetector die) and the receiver circuit (e.g. a CMOS receiver die). As noted above, the parasitic junction capacitance from the photo-detector and the input impedance of the electronic optical receiver circuit will form a 1st order low pass filter which attenuates high frequency signals. Example embodiments of optical receiver circuits are described herein that in some applications may mitigate against one or both of the parasitic junction capacitance from the photo-detector and the input impedance of the electronic optical receiver circuit.

Figure 2:
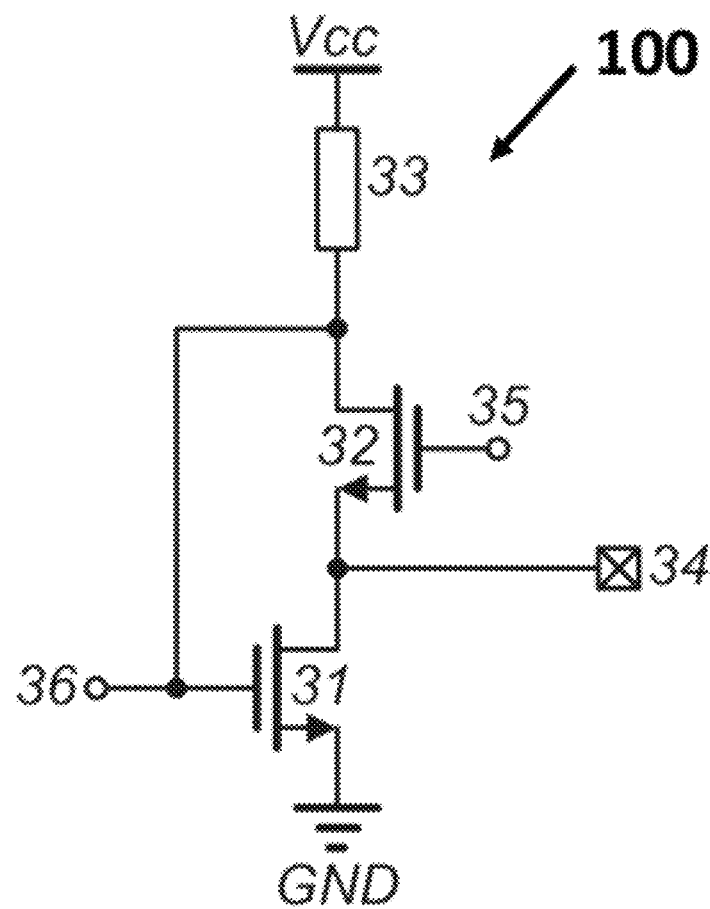
FIG. 2 is an electronic circuit schematic diagram of a low input impedance optical preamplifier in accordance with a first example embodiment.

In this regard, FIG. 2 illustrates a CMOS implemented low input impedance optical preamplifier chip or circuit 100 that can be used in place of the optical receiver chip 24 of FIG. 1 to convert current signals received from a photo detector 21 to voltage signals according to example embodiments. A single-ended input circuit is depicted in FIG. 2. Optical preamplifier circuit 100 includes an input terminal 34 for receiving an electrical current signal from photo detector 21, and an output terminal 36 for outputting an amplified voltage signal. Voltage signal Vcc provides a positive supply and GND is a ground. Optical preamplifier circuit 100 includes an input transistor 31, a boost transistor 32 and a load 33. The input transistor 31 has its low impedance terminal connected to ground, its control terminal connected to the output terminal 36 and its high impedance terminal connected to the input terminal 34. Boost transistor 32 has its low impedance terminal connected to the input terminal 34, its high impedance terminal connected to the output terminal 36 and its control terminal connected to a bias potential 35. Load 33 is connected between the supply voltage Vcc and the output terminal 36. The load 33 can, for example, be a poly resistor, a poly resistor in series with a passive inductor, an active PMOS current mirror, a NMOS/PMOS diode or any other suitable electrical load. In at least some example embodiments, the photo detector 21 is connected to the input terminal 34 in a common cathode fashion or a common anode fashion.

In at least some examples the optical preamplifier circuit 100 of FIG. 2 operates as follows: when a voltage potential signal is applied at input terminal 34, this voltage will produce an amplified copy at output node 36 via boost transistor 32 and load 33. The amplified copy at output node 36 will drive the control terminal of input transistor 31 and draw a current from the input terminal 34. Thus, the input impedance is reduced by the active negative feedback inside a single branch. Assuming the transconductance of input transistor 31 is $g_{m31}$, the transconductance of boost transistor 32 is $g_{m32}$, and the electrical resistance of load 33 is $R_{33}$, the input impedance $R_{34}$ seen at input terminal 34 can be written as:

$$R_{34} = \frac{1}{g_{m32} + g_{m31}g_{m32}R_{33}} \approx \frac{1}{g_{m31}g_{m32}R_{33}} \quad \text{(Equation 1)}$$

Accordingly, the input impedance is approximately reduced by the voltage gain provided in the common gate/common base stage via boost transistor 32 and load 33. Unlike typical optical receiver preamplifier circuits where the boost stage consumes additional DC current, the preamplifier circuit 100 shares the same bias current for both the boost stage and the input transistor 31. The maximum voltage required by preamplifier circuit 100 is at bias terminal 35. The voltage at bias terminal 35 can be made reasonably low to allow for a low supply fabrication process. By way of non-limiting example, in one example configuration using full CMOS implementation, it is expected that the bias voltage at bias terminal 35 will equal a threshold voltage plus two transistor over-drive voltages, which may, for example, around 0.9 Volts.

An input signal current applied to input terminal 34 will produce a voltage signal at output terminal 36. The ratio between the output voltage at terminal 36 and the input current applied to terminal 34 is defined as the transimpedance gain. This transimpedance gain is approximately the reciprocal of input transistor 31. Thus if the output terminal 36 is connected to a control terminal of another transistor, a proportional copy of the input signal current will be produced from the high impedance terminal of that transistor. With the additional output transistor whose control terminal is connected to terminal 36, the circuit behaves as an active current buffer.

In some example configurations, the optical receiver preamplifier or input circuit 100 of FIG. 2 can be used in fiber optic communication receivers to drive the large parasitic capacitance exhibited by a photo-detector circuit. As noted above in example embodiments the photo-detector can be attached directly to input terminal 34 in a common anode or a common cathode configuration.

Figure 3:
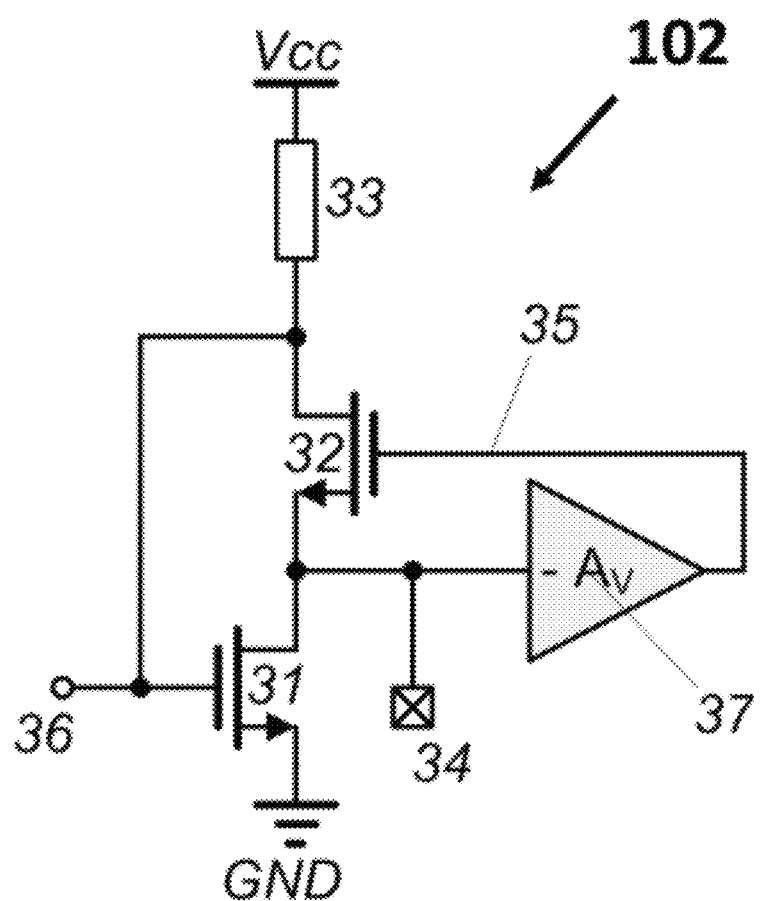
FIG. 3 is a schematic block diagram of an optical preamplifier with an additional boost.

In the circuit 100 of FIG. 2, the control terminal of the input transmitter 31 in a first feedback loop to receive active negative feedback that is proportional to the current received at the input node or terminal 34. In further example embodiments, a further feedback loop is provided such that the control terminal of the boost transmitter 32 is also connected in a feedback loop to receive active negative feedback that is proportional to the current received at the input node or terminal 34, which can result in an even lower input impedance. In this regard, an enhanced optical preamplifier circuit 102 is shown in FIG. 3 according to another example embodiment in which additional boost is added to the preamplifier circuit. In circuit 102 of FIG. 3, the input terminal is denoted as 34 and the output terminal is denoted as 36. The preamplifier circuit 102 includes load 33, input transistor 31, boost transistor 32 and an additional negative feedback stage 37 that includes an amplifier $A_v$ inserted between the input terminal 34 and the control terminal 35 of boost transistor 32. The negative feedback stage 37 has an inverting gain $Av_{37}$. Denoting the transconductance for input transistor 31 and boost transistor 32 as $g_{m31}$ and $g_{m32}$, respectively, and the resistance of load 33 as $R_{33}$, the input impedance $R_{34}$ looking into input terminal 34 can be rewritten as:

$$R_{34} \approx \frac{1}{g_{m31}g_{m32}R_{33}(1+A_{V37})} \quad \text{(Equation 2)}$$

Accordingly, the input impedance will be reduced further approximately by the inverting gain provided in negative feedback stage 37. The negative feedback stage 37 can, for example, be implemented as an active inverting amplifier or some passive coupling networks. For example, the negative feedback stage 37 could be realized by simple common source/common emitter amplifier with a resistive load. The optical preamplifier circuit 102 depicted in FIG. 3 may in some configurations be capable of producing very low input impedance with reasonable power consumption. This low input impedance can be beneficial when interfacing a large source capacitance at high speeds. For example, a large area silicon photo detector for plastic optical fiber may yield a total parasitic capacitance on the order of 10 to 20 pF in advanced CMOS process which will require a very low input impedance from the optical receiver.

Figure 4:
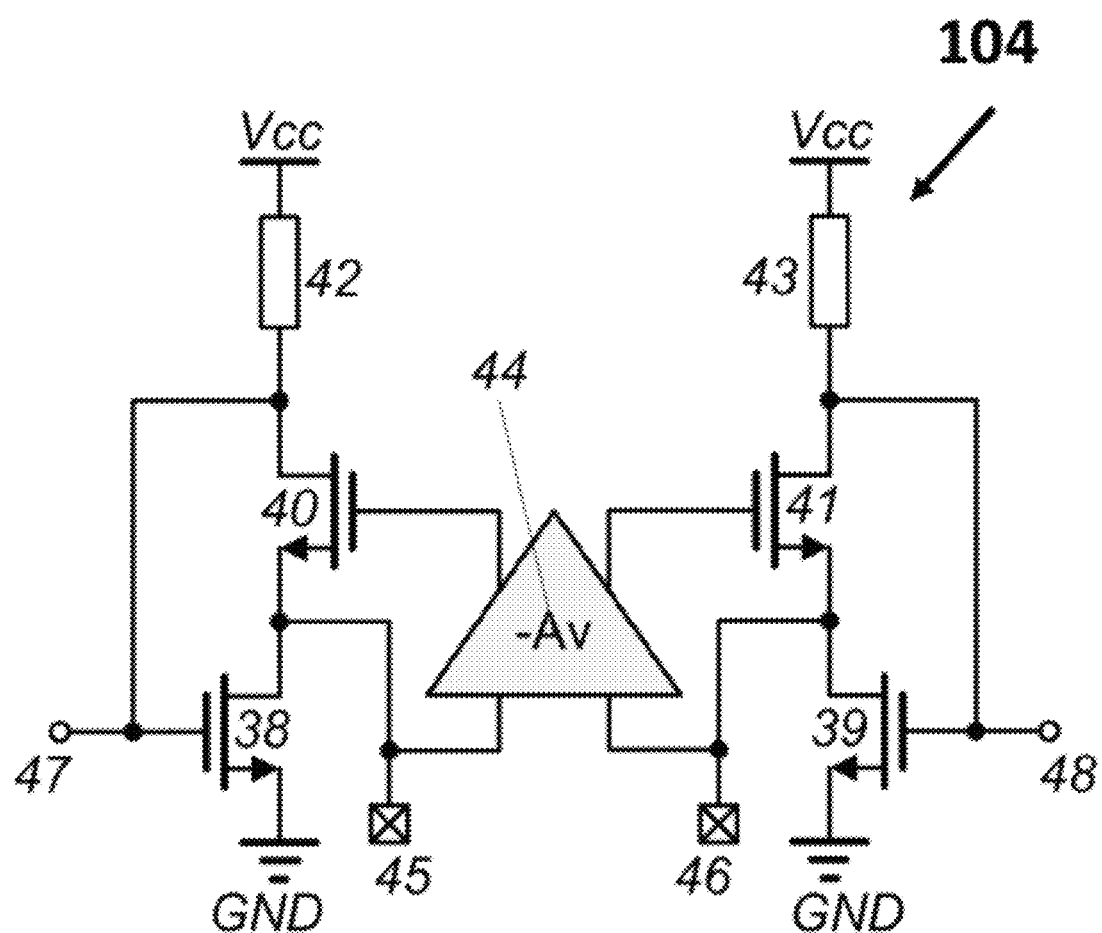
FIG. 4 is a schematic block diagram of an optical preamplifier in accordance with a further example embodiment, the preamplifier being a differential input amplifier with active local feedback.

FIG. 4 shows, according to another example embodiment, a differential implementation of the preamplifier circuit 102 of FIG. 3 to result in an enhanced differential preamplifier circuit 104. Preamplifier circuit 104 includes differential input terminals 45, 46 and differential output terminals 47, 48, input transistors 38, 39, boost transistors 40, 41, loads 42, 43, and a differential inverting amplifier 44. Boost transistors 40 and 41 form a basic boost stage with electrical loads 42 and 43. In at least some example embodiments, the differential inverting amplifier 44 can be implemented as a differential common source amplifier or a cross-coupled common gate amplifier stage.

Figure 5:
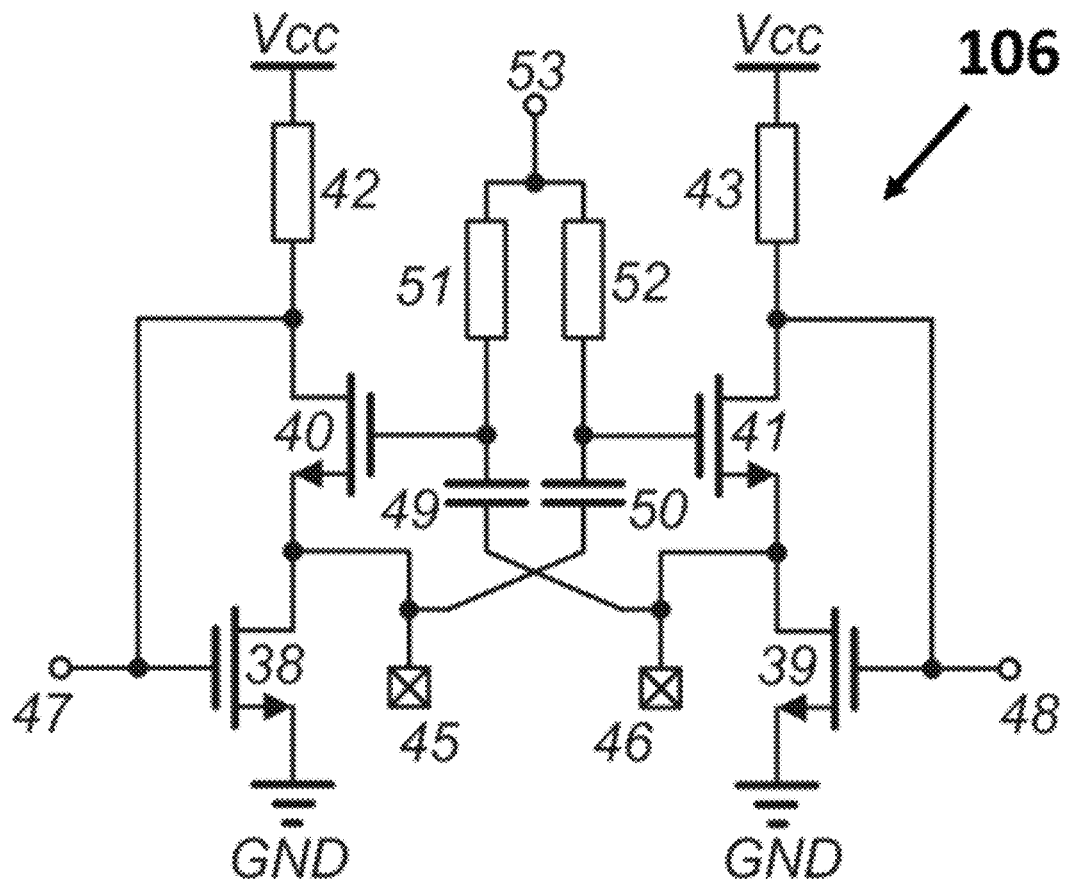
FIG. 5 is a schematic block diagram of an optical preamplifier in accordance with a further example embodiment, the preamplifier having a passive local feedback.

According to another example embodiment, FIG. 5 shows another differential preamplifier circuit 106 which is an enhanced implementation of the circuit 104 described in FIG. 4 with a passive feedback network. In circuit 106, resistors 51 and 52 are used to provide bias potential from a bias terminal 53 to the control terminals of boost transistors 40 and 41. Passive local feedback is provided by capacitors 49 and 50 from the input terminals 45, 46 to the control terminals of transistors 40, 41. At high frequencies, capacitors 49, 50 and bias resistors 51, 52 will provide a cross-coupling path. Assuming a positive input voltage applied at input terminal 45, and a negative input voltage applied at terminal 46, at high frequencies, the negative voltage applied at input terminal 46 will be coupled to the control terminal of boost transistor 40 via capacitor 49. Thus the effective voltage from the control terminal to the low impedance terminal of boost transistor 40 is the difference between the negative input voltage and the positive input voltage, which is doubled at high frequencies compared to low frequencies. Similarly the positive input voltage will be coupled to control terminal of boost transistor 41. In this way, the input impedance may be reduced by a factor of two at high frequency.

Figure 6:
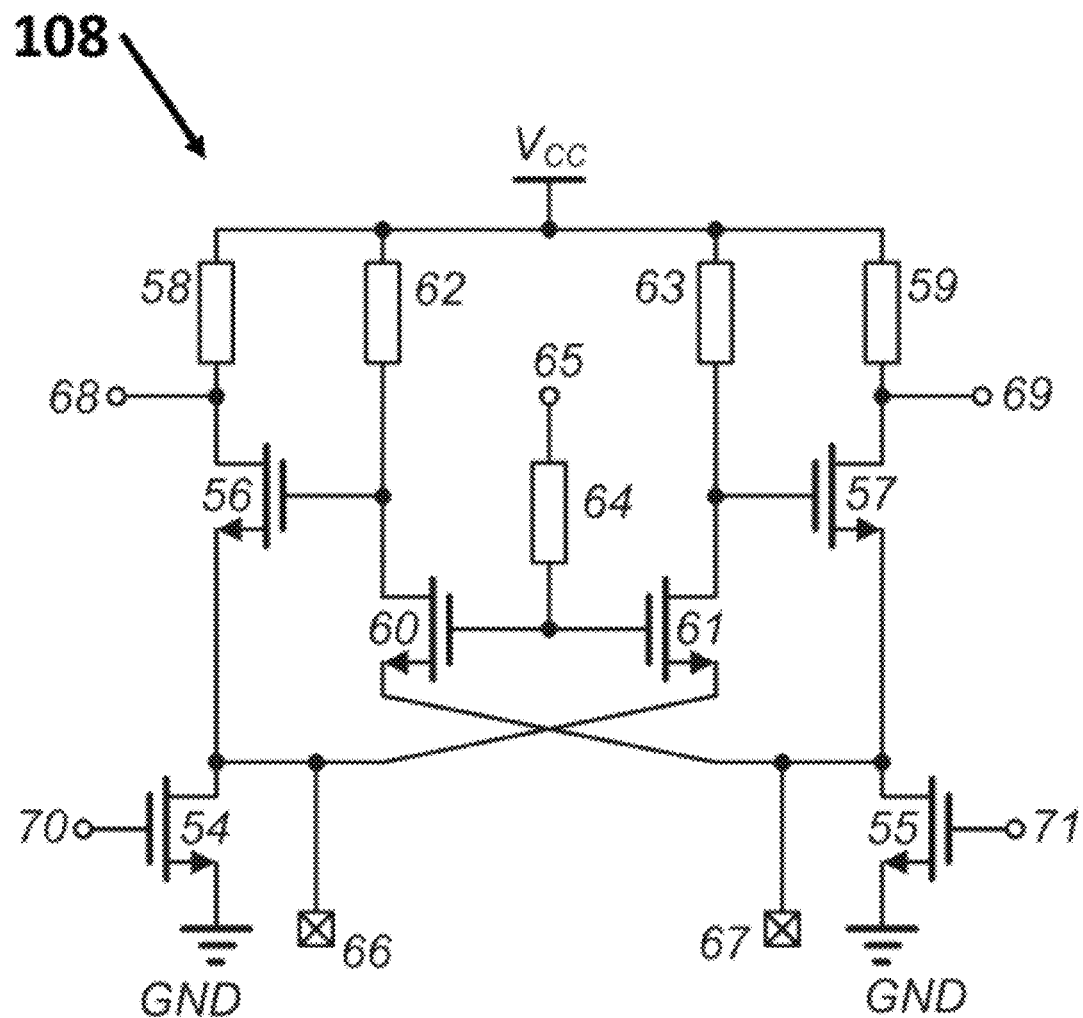
FIG. 6 is a schematic block diagram of an optical preamplifier in accordance with a further example embodiment, the preamplifier being a differential regulated cascode transimpedance amplifier with differential enhanced common gate boost stage.

FIG. 6 illustrates a further example embodiment of a differential optical receiver transimpedance preamplifier circuit 108 derived from a regulated cascode transimpedance amplifier circuit. Preamplifier circuit 108 includes input transistors 56 and 57, bias transistors 54 and 55, and boost transistors 60 and 61. Input transistor 56 and 57 have their low impedance nodes connected to input nodes 66, 67 and their high impedance nodes connected to output nodes 68, 69. Bias transistors 54 and 55 are bias purpose current mirrors having their respective control terminals 70, 71 connected to respective bias voltages. The control terminals of boost transistors 60 and 61 are connected to a bias potential 65. Electrical loads 58 and 59 are connected between output nodes 68 and 69 a positive supply Vcc. Boost transistors 60 and 61 and electrical loads 62 and 63 form a local differential common gate/common base boost stage. The low impedance nodes of boost transistors 60 and 61 are cross-coupled to input nodes 67 and 66, respectively. The high impedance nodes of transistors 60 and 61 are connected to the control terminals of input transistor 56 and 57, respectively. When a differential input signal is applied to input terminals 66 and 67, an amplified version of the signal is provided at the control terminals of input transistors 56 and 57 via boost transistors 60 and 61, respectively. Thus the effective voltage from the control terminals of input transistors 56 and 57 to the low impedance terminals of input transistor 56 and 57 is increased approximately by the voltage gain provided by boost transistors 60 and 61 with electrical loads 62 and 63. Compared to a traditional single-ended regulated cascode transimpedance amplifier, the highest bias dc voltage in circuit 108 is only a high impedance terminal to low impedance terminal plus a control terminal to low impedance terminal voltage. In some applications, this can alleviate DC voltage headroom issues associated with traditional regulated cascode transimpedance amplifiers, facilitating usage in low supply integrated circuit technology.

Figure 7:
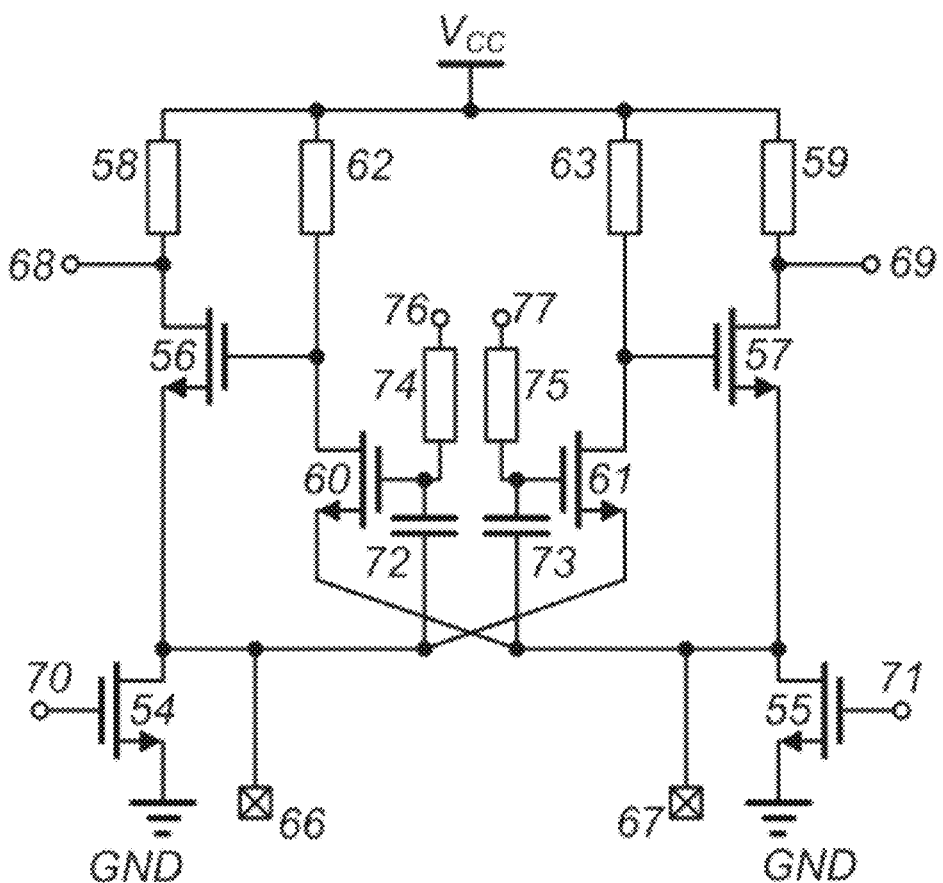
FIG. 7 is a schematic block diagram of an optical preamplifier in accordance with a further example embodiment, the preamplifier being a differential regulated cascode transimpedance amplifier with differential common gate boost stage and additional passive local feedback.

FIG. 7 shows a further enhanced differential input preamplifier circuit 110 modified from circuit 108 of FIG. 6. The capacitive coupling technique in circuit 110 is similar to circuit 108 and is utilized to boost the effective transconductance of transistor 60 and 61 at high frequencies. In circuit 110 of FIG. 7, capacitor 72 and 73 are included to cross-couple the two differential input terminals 66 and 67 to the control terminals of transistors 60 and 61, respectively. Resistors 74 and 75 provide bias potential for the control terminals of transistors 60 and 61 from a bias voltage at bias nodes 76 and 77, respectively. Using such a configuration, the input impedance looking into differential input terminals 66 and 67 will be reduced further by a factor of two when compared to circuit 108 at high frequencies.

Figure 8:
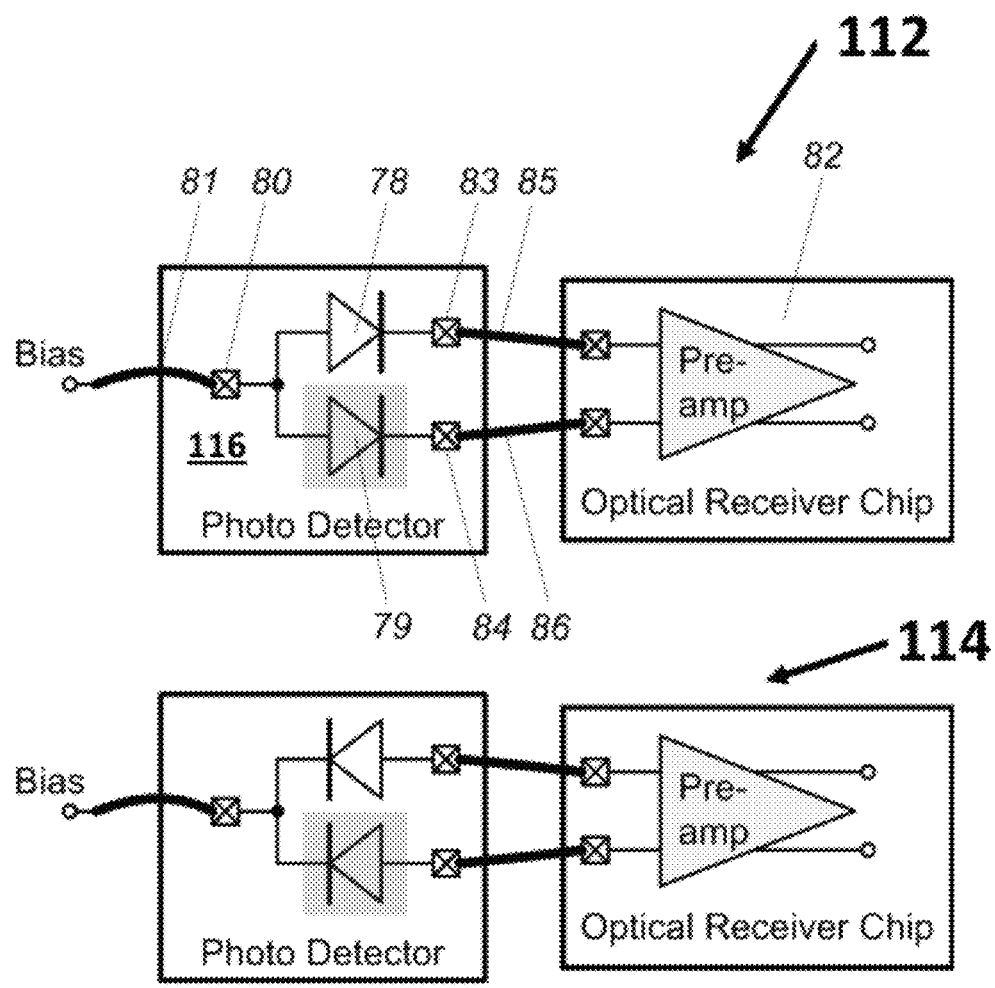
FIG. 8 is block diagram representation of an optical receiver front-end with dual photo detectors in one chip, according to an example embodiment.

FIG. 8 illustrates a further example of an optical receiver front-end assembly 112 according to another example embodiment. The optical receiver front-end assembly 112 includes a photo detector chip 116 and an optical receiver chip 82 assembled together to convert incoming optical light pulses into electrical signal pulses. Unlike the photo detector chip shown in FIG. 1, the photo detector chip 116 of FIG. 8 is a dual photo detector chip in which two photo detectors 78 and 79 are realized on the same chip. The two photo detectors 78 and 79 share a common anode node 80 which acts as a small signal ground for differential signalling. The photo detector 78 is exposed to incoming optical light pulses while the photo detector 79 is a dummy diode that is shielded from the incoming optical light pulses—for example, the photo detector 79 could be covered by metal or other opaque material. Inductive parasitics introduced by the wire 81 connecting anode node 80 to a bias signal are mitigated by the differential dual photo detector configuration. The cathodes 83 and 84 of the photo detectors 78 and 79, respectively, are wired by wires 85 and 86 to the differential inputs of an optical receiver chip 82. The mutual coupling between wires 85 and 86 may in at least some configurations reduce the differential inductance between the wires and thus enhance high speed operation. The differential input preamplifier circuit on the optical receiver chip 82 may for example be implemented in the form of the differential preamplifier circuits 104, 106 or 108 discussed above. FIG. 8 also shows a further alternative configuration for an optical receiver front-end assembly 114 which is identical to assembly 112 except that the orientation of the photo detectors 78 and 79 have been reversed so that they have a common cathode node connected to the bias source and the anodes are respectively connected by wires 85 and 86 to the differential inputs of the optical receiver chip.

Figure 10:
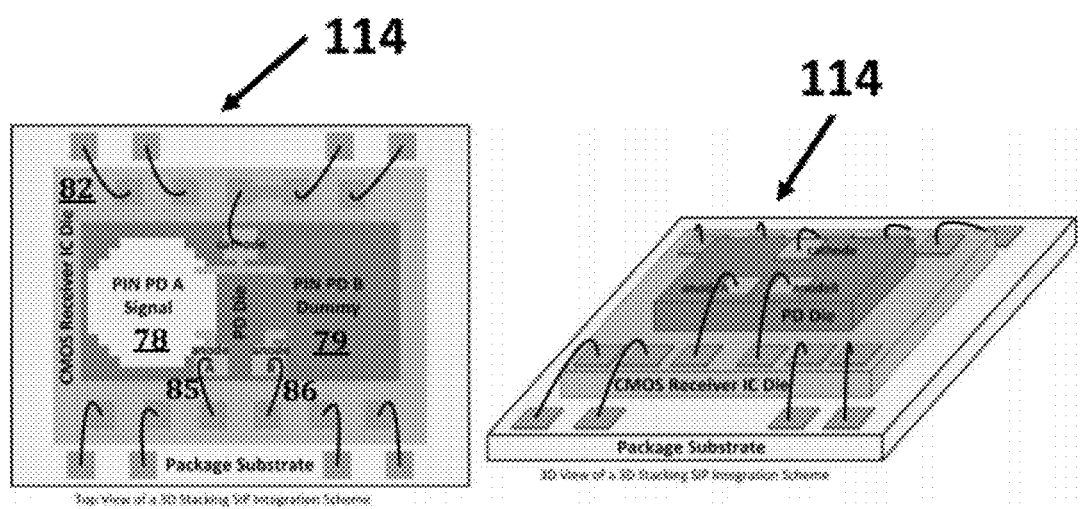
FIG. 10 shows schematic plan and perspective representations of an optical receiver front end implemented as a system in a package according to an example embodiment.
Figure 11:
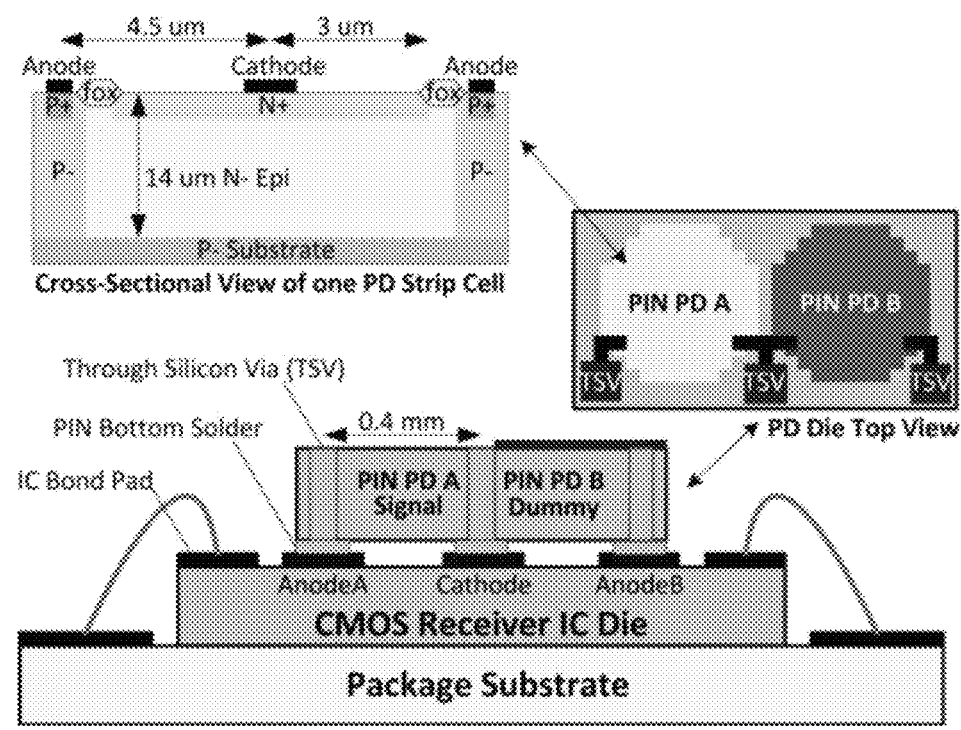
FIG. 11 shows schematic representations of an optical receiver front end implemented as a system in a package according to a further example embodiment.

FIG. 10 illustrates an example embodiment of a system-in-a-package (SIP) implementation of optical receiver front end assembly 114 (or assembly 112) in which a stacked die configuration is used to minimize the length of the wires 85 and 86 that extend between the photo detectors 78, 79 and the optical receiver transimpedance amplifier 82 to mitigate against parasitic bond-wire inductance between photo detector (PD) die and CMOS receiver die that implements transimpedance amplifier 82. In FIG. 10, PIN PD A 78 receives the light signal; PIN PD B 79 is substantially identical to PIN PD B 79 but is shielded from the light signal—for example, PD B 79 may be a dummy diode covered by metal or other opaque covering. The PD die is stacked on top of the CMOS receiver IC die. The shared cathode is wire-bonded onto a floating pad on the CMOS die. The floating pad is further wire-bonded to a package pin to provide a high reverse bias voltage for the PDs 78, 79. Since the signal current only exists in the signal PIN PD A 78, a pseudo differential sensing scheme results. In FIG. 10, the single-ended current signal from PIN PD A 78 can be decomposed into a pair of differential signals and a pair of common mode signals. For the differential signals, in at least some configurations any parasitic beyond the shared cathode pad will be negligible as the cathode pad is a small signal ground. The two close anode bond-wires 85, 86 will exhibit mutual coupling and their net differential inductance will be reduced. For common mode signals, the large bond-wire inductance in series to the cathode attenuates high frequency signals, contributing to a high frequency CMRR FIG. 11 illustrates a similar SIP design with through-silicon-via (TSV) technology adopted.

An alternative to a discrete silicon PD is to utilize an integrated silicon PD on the same receiver die.

The various embodiments presented above are merely examples and are in no way meant to limit the scope of this disclosure. Variations of the innovations described herein will be apparent to persons of reasonable skill in the art, such variations being within the intended scope of the present application. In particular, features from one or more of the above-mentioned embodiments may be selected to create alternative embodiments comprising a sub-combination of features which may not be explicitly described above. In addition, features from one or more of the above-described embodiments may be selected and combined to create alternative embodiments comprised of a combination of features which may not be explicitly described above. Features suitable for such combinations and sub-combinations would be readily apparent to persons skilled in the art upon review of the present application as a whole. The subject matter herein and in the recited claims intends to cover and embrace all suitable changes in technology.

What is claimed is:

1. An optical receiver comprising:
   a photo detector to convert a light signal into a time-varying electrical current signal; and
   a preamplifier circuit to receive the time-varying electrical current signal and output a corresponding voltage signal, the preamplifier circuit comprising:
   a first transistor having:
      (i) a first high impedance node connected to a first input node, the first input node to receive the time-varying electrical current signal from the photo detector, and
      (ii) a first control terminal to receive active negative feedback proportional to the time-varying electrical current signal received at the first input node.

2. The optical receiver of claim 1 wherein the preamplifier circuit includes a second transistor having:
   (i) a first low impedance node connected to the first input node,
   (ii) a second high impedance node connected to (a) the first control terminal of the first transistor to apply the active negative feedback to the first transistor and (b) a supply voltage through a load, and
   (iii) a second control terminal connected to a first bias voltage.

3. The optical receiver of claim 2 wherein the first transistor has a second low impedance node connected to ground, and the first control terminal of the first transistor is connected to an output node to output the voltage signal.

4. The optical receiver of claim 2 wherein the preamplifier includes a feedback loop to apply the first bias voltage to the second control terminal of the second transistor, the first bias voltage being proportional to the time-varying electrical current signal received at the first input node.

5. The optical receiver of claim 4 wherein the feedback loop includes an amplifier.

6. The optical receiver of claim 4 wherein the feedback loop comprises a passive feedback loop.

7. The optical receiver of claim 2 wherein the preamplifier comprises a differential preamplifier, comprising:
a third transistor having:
(i) a third high impedance node connected to a second input node, the second input node to receive a second time-varying electrical current signal from the photo detector, and
(ii) a third control terminal to receive second active negative feedback proportional to the second time-varying electrical current signal received at the second input node; and
a fourth transistor having:
(i) a second low impedance node connected to the second input node,
(ii) a fourth high impedance node connected to (a) the third control terminal of the third transistor to apply the second active negative feedback to the third transistor and (b) the supply voltage through a second load, and
(iii) a fourth control terminal connected to a second bias voltage.

8. The optical receiver of claim 7 wherein the first transistor comprises a third low impedance node connected to ground, the third transistor comprises a fourth low impedance node connected to the ground, the first control terminal of the first transistor is connected to a first output node, and the third control terminal of the third transistor is connected to a second output node.

9. The optical receiver of claim 7 wherein the preamplifier includes a feedback loop to
(a) apply the first bias voltage to the second control terminal of the second transistor, the first bias voltage proportional to the first time-varying electrical current signal received at the first input node, and
(b) apply the second bias voltage to the fourth control terminal of the fourth transistor, the second bias voltage proportional to the second time-varying electrical current signal received at the second input node.

10. The optical receiver of claim 9 wherein the feedback loop includes an amplifier.

11. The optical receiver of claim 9 wherein the feedback loop comprises a passive feedback loop.

12. The optical receiver of claim 7 further comprising a dummy photo detector to provide the second time-varying electrical current signal to the second input node, the dummy photo detector being unaffected by the light signal, the photo detector and dummy photo detector each being connected to a common virtual ground.

13. The optical receiver of claim 1 wherein the photo detector is operatively connected to receive the light signal from a polymer implemented optical channel.

14. The optical receiver of claim 12 wherein a first anode of the photo detector and a second anode of the dummy photo detector are connected to the common virtual ground, a first cathode of the photo detector to provide the first time-varying electrical current signal, and a second cathode of the dummy photo detector to provide the second time-varying electrical current signal.

15. The optical receiver of claim 12 wherein a first cathode of the photo detector and a second cathode of the dummy photo detector are connected to the common virtual ground, a first anode of the photo detector to provide the first time-varying electrical current signal, and a second anode of the dummy photo detector to provide the second time-varying electrical current signal.

16. An optical receiver comprising:
a photo detector circuit to generate a differential electrical signal in response to a light signal; and
a differential preamplifier circuit to receive the differential electrical signal at a first input node and a second input node and to output a corresponding differential output signal at a first output node and a second output node, the differential preamplifier circuit including an active feedback circuit comprising at least two transistors, the active feedback circuit connected to the first and second input nodes, the active feedback circuit to reduce a differential input impedance at the first and second input nodes, the differential preamplifier circuit including a first input transistor and a second input transistor, a first high impedance node of the first input transistor being the first input node, a second high impedance node of the second input transistor being the second input node, the active feedback circuit to provide an active negative feedback signal to control terminals of the first and second input transistors that is proportional to the differential electrical signal received from the photo detector circuit.

17. The optical receiver of claim 16 wherein the photo detector circuit comprises a first photo detector and a second photo detector, the photo detector circuit comprising a material blocking the second photo detector from receiving any light, the first photo detector to provide a first component of the differential electrical signal to the first input node and the second photo detector to provide a second component of the differential electrical signal to the second input node.

18. The optical receiver of claim 16 wherein the first input transistor has a first low impedance node connected to ground, the second input transistor has a second low impedance node connected to the ground, the first control terminal of the first input transistor being the first output node, and the second control terminal of the second input transistor being the second output node.

19. The optical receiver of claim 18 wherein the active feedback circuit includes:
a first boost transistor having a third low impedance node connected to the first input node and a third high impedance node connected to the first control terminal of the first input transistor and to a first supply voltage through a load;
a second boost transistor having a fourth low impedance node connected to the second input node and a fourth high impedance node connected to the second control terminal of the second input transistor and to a second supply voltage through the load; and
a feedback loop to apply a first bias voltage to a third control terminal of the first boost transistor, and to apply a second bias voltage to a fourth control terminal of the second boost transistor, the first bias voltage and the second bias voltage proportional to the differential electrical signal received from the photo detector circuit, the feedback loop including an amplifier.

20. The optical receiver of claim 17 wherein the differential preamplifier circuit comprises:
a first input transistor having a first low impedance node connected to the first input node to receive a first component of the differential electrical signal from the photo detector, and
a second input transistor having a second low impedance node connected to the second input node to receive a second component of the differential electrical signal from the photo detector, the active feedback circuit comprising a boost stage to amplify the first component of the electrical signal and the second component of the electrical signal, to provide the amplified first component to a control terminal of the second input transistor, and to provide the amplified second component to a control terminal of the first input transistor.

21. The optical receiver of claim 1 wherein the first transistor includes a MOS transistor, the high impedance node being a drain junction of the MOS transistor and the control terminal being a gate of the MOS transistor.

* * * * *